US005604436A

United States Patent [19]
Henritzy et al.

[11] Patent Number: 5,604,436
[45] Date of Patent: Feb. 18, 1997

[54] CHRISTMAS LIGHT STRING CIRCUIT TESTER

[76] Inventors: Charles L. Henritzy, 66 Stephens Rd., Grosse Pointe Farms, Mich. 48236; William Maddock, 303 Wilkes Court, Auroa, Ontario, Canada, L4G 6G7

[21] Appl. No.: 526,558

[22] Filed: Sep. 12, 1995

[51] Int. Cl.⁶ ................................................. G01R 31/02
[52] U.S. Cl. .................... 324/414; 324/133; 324/537; 324/556; 340/642
[58] Field of Search .............................. 324/403, 414, 324/508, 537, 550, 555, 556, 133, 149, 72.5; 340/641, 642

[56] References Cited

U.S. PATENT DOCUMENTS

| | | | |
|---|---|---|---|
| 3,760,266 | 9/1973 | Ocasio et al. | 324/414 |
| 4,918,392 | 4/1990 | Torres | 324/537 |
| 4,999,574 | 3/1991 | Stephens | 324/133 |
| 5,047,721 | 9/1991 | Farley | 324/414 |
| 5,179,339 | 1/1993 | Volk, Jr. | 324/414 |
| 5,319,312 | 6/1994 | Segilia | 324/414 |
| 5,369,363 | 11/1994 | Hey | 324/414 |

*Primary Examiner*—Kenneth A. Wieder
*Assistant Examiner*—Diep Do
*Attorney, Agent, or Firm*—Remy J. VanOphem; Thomas A. Meehan; John VanOphem

[57] ABSTRACT

A device for finding an inoperative bulb in a series string of lights, such as a string of Christmas tree lights having a plug, a pair of electrically conductive leads connected to the plug and having their ends terminating within a casing of the device, a polarity switch having first and second terminals each connected to a lead of the pair of leads connected to the plug, a probe for insertion into and contact with the wire of the socket of the light string, and an indicator circuit for determining whether an electric current is passing through the series string thus indicating the presence or lack of an inoperative bulb. The indicator circuit is located between the polarity switch and the probe and a protective sheath is provided to prevent any part of the probe from being exposed to avoid a user from being shocked, the protective sheath being continuously biased to cover the probe.

7 Claims, 2 Drawing Sheets

U.S. Patent  Feb. 18, 1997  Sheet 1 of 2  5,604,436
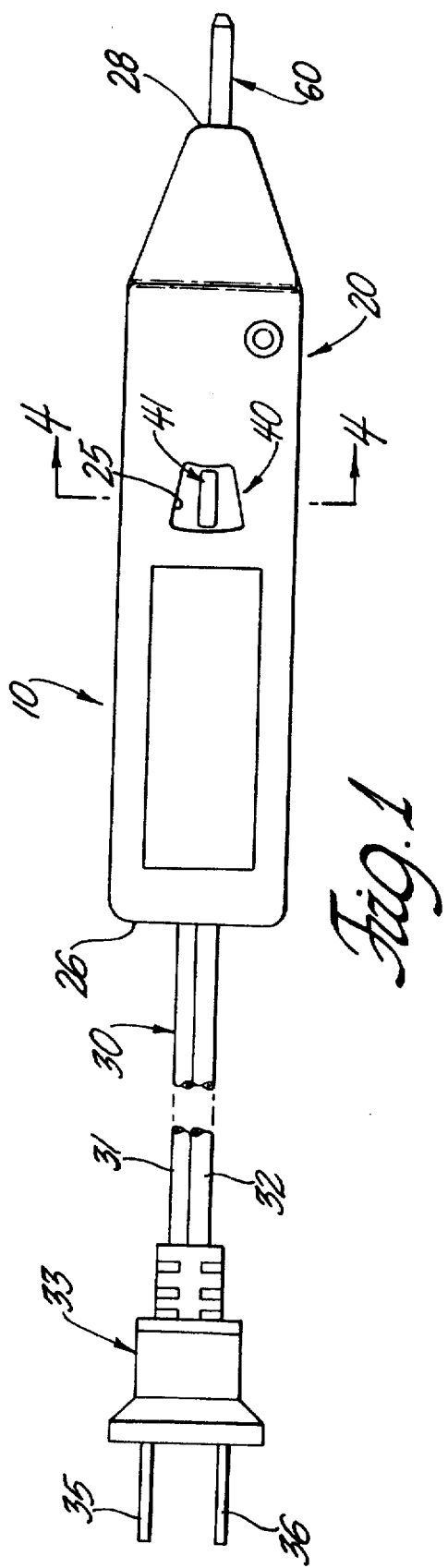
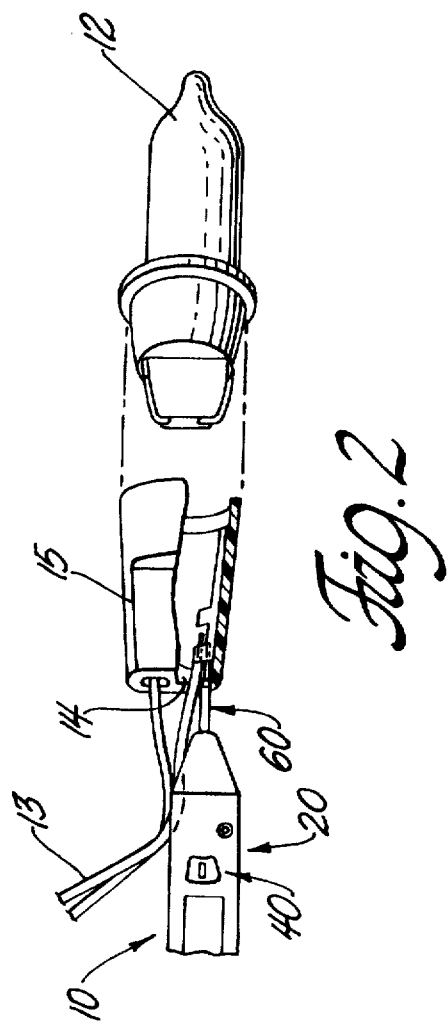

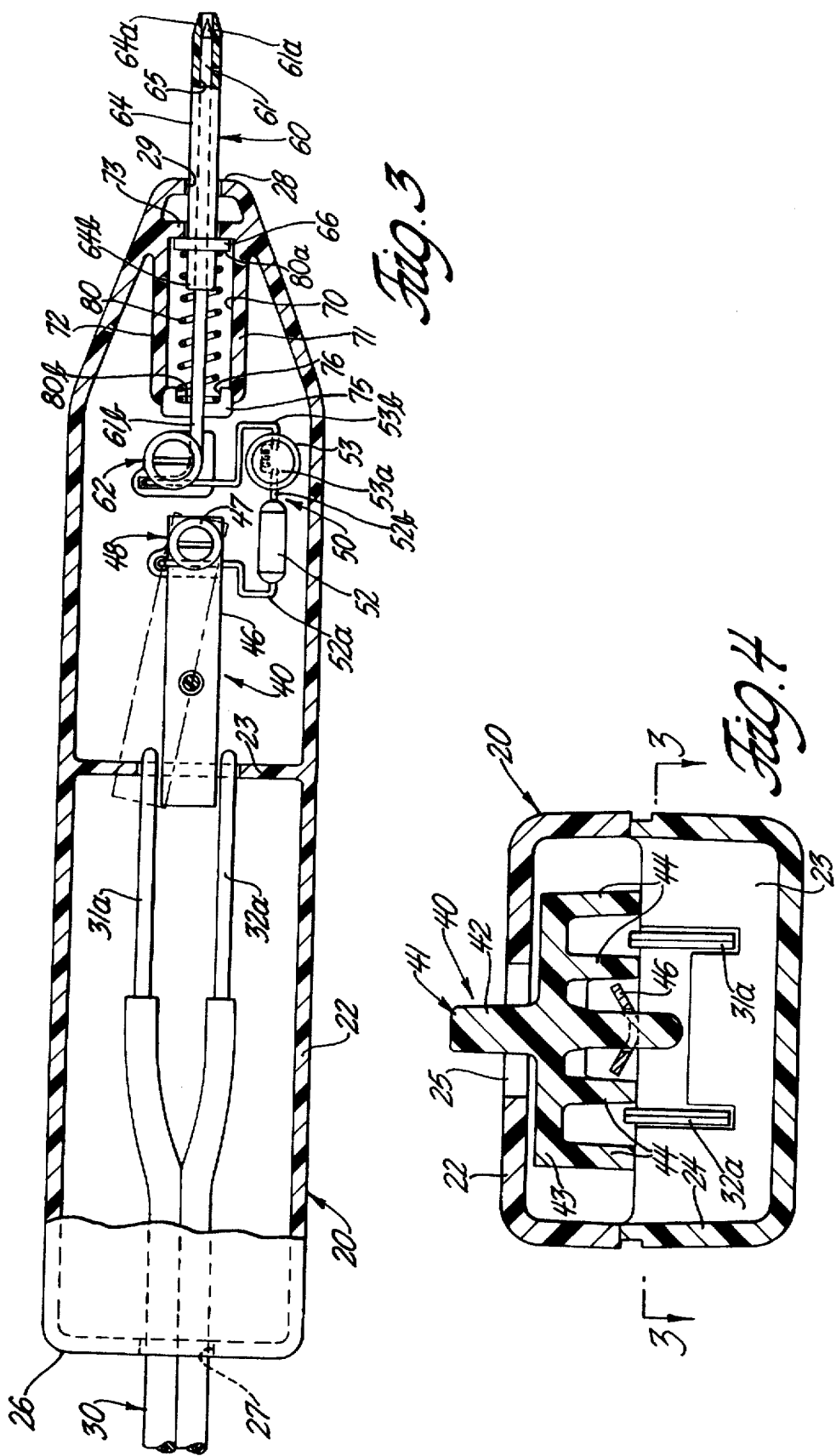

CHRISTMAS LIGHT STRING CIRCUIT TESTER

BACKGROUND OF THE INVENTION

1. Field of the Invention

The present invention relates to an apparatus and method for finding an inoperative bulb in a series string of lights which becomes inoperable when one bulb becomes inoperative. More particularly, the present invention relates to providing a tester which is safe, is quick and is easy to use to determine which bulb or bulbs in the series circuit is inoperative so that the inoperative bulb may be replaced and the series string of lights returned to an operative state. The present invention further relates to a circuit tester which is economical to produce and safe to prevent a person from coming in contact with an exposed electrode. In addition, the tester can be used to check the polarity of 120 volt AC outlets and other electrical devices such as lamps.

2. Description of the Prior Art

Strings of Christmas lights are used to decorate during the respective season. Usually, individuals decorate using many multiples of series strings of lights to provide an impressive and decorative effect to show enthusiastic support for the holiday. However, due to the nature and quantity of the strings of lights used, prolonged illumination, physical abuse and inexpensive manufacturing, there is a relatively high frequency for bulbs to burn out, break and to just not work, possibly due to bad contact or other phenomena. It therefore becomes necessary to determine where the series string of lights is "broken", meaning where there is a break in the circuit which prevents operable lights from illuminating due to at least one bulb having become inoperable.

Prior to the present invention there have been many attempts to provide a circuit tester for use in determining the position of a break in a series string of lights. However, none of the previous circuit testers have overcome some significant problems within the prior art. In particular, none of the prior art circuit testers provide a simple, straight forward and safe circuit tester which does not require a battery, which does not require the operator to encounter an exposed wire, which does not require the operator to repetitively plug and unplug the tester from an electric outlet while performing the test, and which does not require the operator to remove the bulb from the socket in order to perform the test.

For example, U.S. Pat. No. 3,760,266, to Ocasio et al., discloses a single lead, plug-in type circuit tester having a bare lead which is inserted into one of the light sockets of a series string of lights to attempt to cut the inoperative bulb out of the circuit and by process of elimination pinpoint which particular bulb is inoperative. However, the Ocasio et al. device requires that, prior to testing the string, the operator first properly orientate and plug the circuit tester's plug prongs into the wall outlet socket so that the particular light socket of the series string being probed by the tester's bare lead forms a circuit with the tester. Ocasio et al. teach that the circuit tester first be used to probe a light socket of a series string of lights which is known to be in proper working order so that the circuit tester's plug may be properly oriented in the wall outlet socket before an inoperative series string of lights may be properly tested. Thus, if the Ocasio et al. indicator light goes on, then the circuit tester is properly orientated and correctly plugged into the wall outlet socket. If, however, the indicator light of the circuit tester does not go on, since the series string of lights is known to be in working order, the prongs of the circuit tester's plug must be switched to the opposite position in the prong receptacles of the wall outlet socket and only then can the circuit tester be used to properly probe and test an inoperative series string of lights.

Additional devices have been developed to overcome some of the shortcomings of the Ocasio et al. reference, but have resulted in problems of their own. U.S. Pat. No. 5,369,363, to Hey, discloses an implement for removing, installing and testing Christmas light bulbs which combines the features of a device for carefully and safely removing the bulbs from the series string of lights and testing the individual bulb utilizing power supplied from a battery in the handle of the device. However, the above description alone clearly shows the inherent drawbacks associated with using such a device. The device requires the operator to remove, test, and install, possibly, every bulb on a series string of lights before the inoperative bulb is ultimately found. Additionally, the Hey device is not capable of determining whether there is a break in the wire of the series string of lights, but instead merely only detects inoperative bulbs. The Hey device is slow, inefficient, expensive to manufacture and requires the operator to use a battery, which is problematic in itself if the operator does not have the required type of battery available and properly charged. The same can be said for the light bulb tester disclosed in U.S. Pat. No. 5,179,339, to Volk, Jr., which also requires the use of a battery and has exposed probes. Other examples of patents utilizing batteries in a series light string tester are set forth in column 1 of U.S. Pat. No. 5,319,312, to Segilia, which details many other types of series light string testers.

The Segilia reference is concerned with providing an apparatus for locating an inoperative bulb in a string of lights and in particular with providing a device which can be plugged into a bulb socket in the series string of lights and will indicate the particular direction within the string where the inoperative bulb is located. However, the Segilia reference teaches a device which requires that the bulb be removed from the socket and that the tester be inserted therein, a process which requires significant time, effort, patience, and also requires that the tester properly adapt to the type of socket. This can be a problem since series strings of lights from different manufacturers can have differently configured sockets. Furthermore, the Segilia apparatus requires a battery which, as stated above, is problematic.

Thus, the prior art requires devices wherein the operator must either utilize a battery with the device in order to avoid problems associated with standard outlets, or the operator must remove each bulb of the string of lights in order to find the inoperative bulb and in the case where the wire itself is defective and not a bulb, many of the prior art devices will not provide information to the operator to make such a determination.

Thus, there has long been a need for a circuit tester for use in determining where, in a series string of lights, there is an inoperable bulb or break in the wire, which is easy to use, inexpensive, and simple to manufacture, which has electricity supplied thereto by a plug which is plugged into any standard electrical outlet or socket, which incorporates a switch for toggling between a lead from each pole of the outlet supplying 110–120 alternating current, typically found in most American homes and businesses, and which protects the operator from coming in contact with any exposed, electrically conductive leads during testing.

SUMMARY OF THE INVENTION

The present invention relates to an improved apparatus and method for testing a series string of lights, such as Christmas light strings, and determining which bulb is inoperative or where there is a break in the wire which prevents the series string of lights from operating. The apparatus includes a polarized plug having first and second male prongs for insertion into a standard electric outlet supplying 110–120 alternating current, a first wire and a second wire respectively connected to the first and second male prongs of the plug and terminating within a housing, a probe terminal having an insulated probe guard continuously biased to cover the probe when not in use, an indicator circuit for indicating the conduction of current through the apparatus and connected to the probe, and a polarity switch having a first end connected to the indicator circuit and the probe and an opposite end for switching between the first and second wires. The present invention further includes a resistor and a light-emitting diode (LED) or bulb within the indicator circuit for indicating when the circuit tester has completed a circuit, or when not lit indicating the inoperative bulb or the break within the wire.

The insulated probe guard is specifically designed to retract within the housing of the circuit tester when the operator inserts the probe within an aperture of a particular light bulb socket where the wire of the series string of lights is connected. As the probe is inserted further into the aperture, the insulated probe guard continues to be retracted within the housing of the tester.

The tester of the present invention is preferably adapted to operate with typical series strings of lights which operate at a nominal voltage of 3.5 volts per lamp. Accordingly, the tester includes a resistor which is designed to prevent any damage from occurring to the bulbs of the series string of lights which are being tested. The resistor limits the current flowing to the LED and through the string being tested to 15 milliamps for safety reasons.

Other objects and advantages of the present invention will become apparent in the following detailed description of the invention with reference being made to the accompanying drawings.

BRIEF DESCRIPTION OF THE DRAWINGS

FIG. 1 is a plan view of one embodiment of a circuit tester according to the present invention;

FIG. 2 is perspective view of a circuit tester according to the present invention shown in use, actually testing a bulb of a string of lights;

FIG. 3 is a partial cross-sectional view of the circuit tester of FIG. 1 taken along the line 3—3 shown in FIG. 4; and FIG. 4 is a cross-sectional view of the circuit tester of FIG. 2 taken along the line 4—4 in FIG. 1.

DETAILED DESCRIPTION OF THE PREFERRED EMBODIMENT

Referring to the drawings generally and in particular to FIGS. 1 and 3, there is shown a circuit tester 10 according to the present invention for use in determining the location of a break in a string of lights connected in series, such as a string of Christmas lights. In particular, the circuit tester 10 of the present invention is particularly useful in determining which bulb 12, see FIG. 2, in a series string of lights 13 is defective and preventing the proper operation of the string of lights 13.

The circuit tester 10 preferably includes a casing 20 having a first or upper portion 22 and a second or lower portion 24 which are connected together using any known device for keeping the upper and lower portions 22 and 24 joined. While the circuit tester 10 of the present invention is disclosed as utilizing a particular casing 20, it should be noted that many other styles and designs for the casing 20 may be utilized without departing from the scope of the present invention.

The casing 20 is preferably made out of a consumer-grade plastic capable of enduring significant shocks and loads without breaking or unduly fatiguing. An example of such a plastic is an ABS modified polycarbonate. Such a plastic is easy to injection mold with little post-mold processing required and may be easily painted or colored. However, it is possible to manufacture the present invention out of other materials, the present invention not being limited by the type material used to manufacture the casing 20. The casing 20 contains other features of particular importance to the present invention which will be described in more detail below.

The circuit tester 10 of the present invention obtains power from an electric cord 30 having a first wire 31, a second wire 32, and a plug 33. The electric cord 30 is preferably a standard electric cord utilized for a household appliance and compatible with a standard electric outlet. The plug 33 is of the polarized type and has a first prong 35 connected to the first wire 31 of the electric cord 30 and a second prong 36 connected to the second wire 32 of the electric cord 30. In the preferred embodiment, the electric cord 30 enters the casing 20 at an end 26 thereof through a hole 27 having a first half in the upper portion 22 and a second half in the lower portion 24 of the casing 20. The electric cord 30 is secured within the casing 20 using any known means which will prevent the electric cord from being removed from the casing 20. Typically, the electric cord 30 is press fit within the hole 27 of the casing 20, or it is attached to or wrapped around a post (not shown) within the casing 20.

The electric cord 30 terminates within the casing 20 where the first wire 31 is split from the second wire 32, and the protective coating of the respective wires is stripped back to allow attachment to metal terminals 31a and 32a, respectively, thereof. The terminals 31a and 32a are positioned within the casing 20 and held in place by a rib 23 at a point preferably within the middle one-third of the casing 20, but may be positioned at any other location in the casing 20 without departing from the scope of the present invention. The terminals 31a and 32a are spaced a predetermined distance apart such that they cannot come into contact with each other, see FIG. 3, as explained in more detail below.

The circuit tester 10 of the present invention is significantly more efficient and easy to operate than those of the prior art due to the addition of a switch 40. The switch 40 allows the operator of the circuit tester 10 to select between which wire, the first wire 31 or the second wire 32, is to be placed in contact with the bulb 12 of the series string of lights 13 to complete a new series circuit for determining the position of the break in the string 13 or which bulb of the string of lights is inoperative. The addition of the switch 40 to the circuit tester 10 eliminates the problems associated with polarity in common outlets.

The switch 40 includes a body 41 having a first or upper portion 42 which extends through an aperture 25 in the upper portion 22 of the casing 20. The upper portion 42 is designed to be engaged by the operator of the circuit tester 10 during use, to switch between the wires 31 and 32 of the electric cord 30. The body 41 is designed of an electrically insulative material, preferably a plastic similar to the casing 20, such that the operator cannot be electrocuted when encountering the switch 40. The body 41 further includes a lower portion 43 consisting of a plurality of ribs 44 which contact and slide along the rib 23 of the casing 20, in the preferred embodiment as shown in FIGS. 3 and 4.

The switch 40 includes a contact 46 made of an electrically conductive material, preferably copper, for electrically connecting one of the terminals 31a or 32a to a switch terminal 48. The switch terminal 48 includes an electrically conductive screw 47, preferably copper, connected to a post (not shown) in the housing, about which the body 41 and the contact 46 rotate together. The switch terminal 48 is connected to an indicator circuit 50 which preferably consists of a resistor 52 and an indicator light 53.

The resistor 52 has a switch lead 52a and a diode lead 52b. The switch lead 52a of the resistor 50 is connected to the switch terminal 48 and is therefore in electrical contact with the contact 46 of the switch 40. The diode lead 52b of the resistor 52 is connected to the indicator light 53 which preferably consists of a light-emitting diode. The indicator light 53 or light-emitting diode has a resistor lead 53a connected to the diode lead 52b of the resistor 52 and a probe lead 53b connected to a probe 60 which is more fully described below.

The resistor 52 is preferably designed to limit the current coming from the electric outlet (which is typically 110±10 v) to a safe point which will not harm the bulbs remaining in the series string of lights 13. The resistor 52 of the present invention is preferably chosen to have a resistance of approximately 8 kilo-ohms. Typically, the bulbs 12 of the series string of lights 13 are designed to work on between 2.5 v and 3.5 v. However, the resistor 52 should be chosen such that there is enough current in the indicator circuit 50 of the circuit tester 10 to cause the indicator light 53 to be lit bright enough for the operator to observe that the inoperative bulb 12 has not been located and to prevent too much current from being applied to the bulbs remaining in the string.

The probe 60 is specially designed to prevent the operator of the circuit tester 10 of the present invention from coming into contact with the wire lead which is used to contact the wire of the series string of lights 13. The probe generally is composed of a probe lead element 61 connected to a probe terminal 62 and a device for sheathing the probe lead element 61. Preferably, the device for sheathing the probe lead element 61 is a sheath 64 which is continuously biased to cover the probe lead element 61 but is also retractable within the casing 20 of the circuit tester 10 of the present invention.

The probe lead element 61 has a first end or tip 61a which is preferably pointed and disposed outside of an end 28 of the casing 20. The probe lead element 61 and the sheath 64 both pass through a hole 29 in the casing 20 and extend therefrom. The probe lead element 61 is specifically designed to have its end 61a inserted within a hole 14 of a bulb receptacle 15 of the series string of lights 13. The probe lead element 61 has an opposite or base end 61b located within the casing 20 and preferably anchored and electrically connected to the probe terminal 62. The probe lead element 61 is contained within a bore 65 of the sheath 64 such that the sheath 64 is movable along the axial length of the probe lead element 61 and is concentric therewith.

The sheath 64 has an end 64a which is proximate the end 61a of the probe lead element 61 when the sheath 64 is in the extended position, that is the sheath 64 is biased to extend out of the casing 20 as much as possible. The sheath 64 further includes an opposite end 64b which terminates between the end 61a and opposite end 61b of the probe lead element 61 and within the casing 20 of the circuit tester 10. The opposite end 64b has proximate thereto a stop 66 designed to travel within a passageway 70 located within the casing 20 and aligned with the hole 29 of the end 28 such that the sheath 64 can retract within the passageway 70.

The passageway 70 is preferably designed utilizing a wall 71, a wall 72, an end 73, and a cap 75 located at the opposite end of the passageway 70 from the end 73. The passageway 70 is designed to receive the sheath 64 when it is retracted within the casing 20 of the circuit tester of the present invention. The sheath 64 is biased outward from the casing 20 to an extended position by a spring 80.

The spring 80 is located within the passageway 70 and is concentrically located on the probe lead element 61 and the opposite end 64b of the sheath 64. The spring 80 includes an end 80a which abuts the stop 66 on one side thereof and biases the stop 66, and therefore the sheath 64, toward the end 73 of the passageway 70. The spring 80 also includes an opposite end 80b which is preferably located within a recess 76 of the cap 75. The spring 80 is designed to bias against the cap 75 and the stop 66. The spring 80 is chosen with a predetermined force such that the sheath 64 will not retract within the passageway 70 of the casing 20 unless the operator intends for the sheath 64 to be retracted. However, the force with which the spring 80 acts is also chosen such that in use the operator will not have a difficult time inserting the end 61a of the probe lead element 61 within the hole 14 of the bulb receptacle 15.

The probe lead element 61 is preferably made out of a quality grade copper or other alloy such that the lead has an excellent conductivity and excellent structural rigidity. The opposite end 61b is connected to the probe terminal 62 which preferably consists of a threaded screw or bolt and washer assembly located within a threaded post of the casing 20. The opposite end 61b of the probe lead element 61 is connected to the probe terminal 62 such that it is electrically connected to the probe lead 53b of the indicator light 53 thereby forming a complete circuit from the contact 46 to the end 61a of the probe lead element 61. Thus, when an operator contacts the probe lead element 61 to the series string of lights and the contact 46 is made to connect to the contact wire of the plug 33, a complete circuit is formed. The current supplied by the electric outlet flows, and the indicator light 53 of the indicator circuit 50 is lit to show the completion of the circuit.

In use, the circuit tester of the present invention is more reliable, easier to use, and safer than the devices of the prior art. When the operator decides to test the series string of lights 13, the plug 33 of the circuit tester 10 of the present invention is plugged into an electric outlet supplying electricity at the appropriate voltage. Either before or after the above, the plug of the series string of lights (not pictured) containing the inoperative bulb is also plugged into either the same or a different electric outlet which is also supplying electricity at the appropriate voltage.

The operator next picks a point to begin testing the series string of lights 13 to determine the location of the inoperative bulb 12. Preferably, the operator picks a point nearly in the middle of the series string of lights 13. The operator aligns the end 64a of the sheath 64 with the hole 14 of the bulb receptacle or socket 15 and slowly pushes the casing 20 toward the bulb receptacle 15 such that the end or tip 61a of the probe lead element 61 begins to enter the hole 14 and the sheath 64 begins to retract into the passageway 70 and within the casing 20. The operator continues to push on the circuit tester 10 until the end 61a of the probe lead element 61 will not insert any further and such that it contacts the wire of the series string of lights 13.

Prior to, during, or after the above step, the operator sets the switch 40 by pressing the body 41 to one side of the aperture 25 of the casing 20 such that the contact 46 is connected to either the terminal 31a or the terminal 32a of the wires 31 and 32, respectively. Assuming the operator has pushed the body 41 of switch 40 to the side of the aperture 25 such that the contact 46 is touching the terminal 31a of the wire 31, there may or may not be a circuit completed. Completion of a circuit will depend upon the location of the break in the series string of lights 13 and the position of the switch 40 which determines whether the live or neutral side of the electric outlet to which the circuit tester 10 is plugged into is applied thereto.

Once the circuit tester 10 of the present invention is placed in series connection with a series string of lights such that the break or the inoperative bulb in the series string of lights is eliminated from the circuit, the indicator lamp 53 will light when the operator places the switch 40 on either the first wire 31 or second wire 32 of the cord 30, whichever wire is connected to the live side of the electric outlet. Next, the location of the inoperative bulb or break in the series string of lights can be simply determined by process of elimination.

Thus, the circuit tester 10 of the present invention eliminates the necessity of testing the electric outlet to determine which side is live and which side is neutral. Furthermore, the circuit tester 10 of the present invention is more safe for the operator to use than prior art devices because of the inclusion of the sheath 64 to prevent the probe lead element 61 from being freely exposed once the plug 33 is inserted in the electric outlet in the wall. The circuit tester 10 of the present invention also operates to more quickly and easily determine the location of a break or inoperative bulb in a series string of lights 13 than prior known devices by eliminating the necessity for testing an outlet, utilizing a battery, or complicated or expensive circuitry.

While the invention has been described in terms of a preferred embodiment, it should be apparent that other forms could be adopted by one skilled in the art without departing from the spirit of the present invention. Accordingly, the scope of the invention is to be limited only by the following claims.

What is claimed is:

1. A device for testing a defective string of light bulbs electrically connected in series or for checking polarity of other outlets or devices, said device comprising:

a plug having a first prong and a second prong;

an electrically conductive first wire having a plug end and a switch end, said plug end of said first wire electrically connected to said first prong of said plug;

an electrically conductive second wire having a plug end and a switch end, said plug end of said second wire electrically connected to said second prong of said plug;

a polarity switch comprising:
      a first wire terminal electrically connected to said switch end of said first wire;
      a second wire terminal electrically connected to said switch end of said second wire;
      a main terminal spaced from said first wire terminal and said second wire terminal; and
      means for selectively and electrically connecting one of either said first wire terminal or said second wire terminal to said main terminal;

an indicator circuit comprising:
      a switch terminal electrically connected to said main terminal of said polarity switch;
      means for indicating the conduction of an electric current through said device, said indication means electrically connected to said switch terminal; and
      a probe terminal electrically connected to said indicating means;

an electrically conductive probe having a probe base and a probe tip, said probe base being electrically connected to said probe terminal of said indicator circuit; and an insulated casing supporting said first wire, said second wire, said polarity switch, said indicator circuit, and said probe.

2. The device of claim 1 wherein said polarity switch defines a first position wherein said first wire terminal of said polarity switch is electrically connected to said main terminal of said polarity switch, a second position wherein said second wire terminal of said polarity switch is electrically connected to said main terminal of said polarity switch, and a third position wherein said main terminal of said polarity switch is electrically disconnected from both said first wire terminal and said second wire terminal such that no electric current is conducted through said device.

3. The device of claim 1 wherein said indicating means comprises:

a resistor having a switch lead and a diode lead, said switch lead electrically connected to said switch terminal of said indicator circuit; and a light-emitting diode having a resistor lead and a probe lead, said resistor lead electrically connected to said diode lead of said resistor, said probe lead electrically connected to said probe terminal of said indicator circuit.

4. The device of claim 3 wherein said resistor has an approximate resistance of 8 kilo-ohms.

5. The device of claim 1 wherein said probe base of said probe is cylindrical, said probe tip of said probe is tapered to a point, and said probe is fixed with respect to said casing.

6. The device of claim 5 further comprising:

an electrically insulating probe guard having a biased end and a tip end, said probe guard having a hollow and cylindrical shape, said tip end of said probe guard being tapered, said probe guard concentrically placed about a portion of said probe corresponding to said tip end of said probe; and means for biasing said biased end of said probe guard in a direction toward said probe tip of said probe so as to push said probe guard along said probe until said tip end of said probe guard rests just beyond said tip end of said probe, said probe guard being able to retract into said casing against said biasing means along said probe so as to expose a portion of said probe corresponding to said probe tip of said probe.

7. The device of claim 1 wherein said casing has a wire end, a hole, a body portion, and a probe end, said hole located in said wire end of said casing, said first wire and said second wire entering said casing through said hole in said wire end of said casing, a portion of said probe corresponding to said probe tip of said probe extending from said probe end of said casing, and said casing being tapered toward said probe end.

\* \* \* \* \*